(12) United States Patent
Jomaa (10) Patent No.: US 8,555,494 B2
(45) Date of Patent: Oct. 15, 2013

(54) METHOD OF MANUFACTURING CORELESS SUBSTRATE

(75) Inventor: Houssam Jomaa, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 11/865,261

(22) Filed: Oct. 1, 2007

(65) Prior Publication Data

US 2009/0084598 A1 Apr. 2, 2009

(51) Int. Cl.
*H01K 3/10* (2006.01)

(52) U.S. Cl.
USPC .............................. 29/852; 29/830; 174/262

(58) Field of Classification Search
USPC ............ 29/830, 831, 846, 847, 852; 174/255, 174/262; 216/18, 20; 257/737, 778
See application file for complete search history.

(56) References Cited

U.S. PATENT DOCUMENTS

| | | | | |
|---|---|---|---|---|
| 3,152,938 | A | * | 10/1964 | Osifchin et al. ............... 216/20 |
| 5,274,912 | A | * | 1/1994 | Olenick et al. ................ 29/830 |
| 6,686,660 | B2 | * | 2/2004 | Nemoto ...................... 257/737 |
| 7,093,356 | B2 | * | 8/2006 | Imafuji et al. ................ 29/852 |

\* cited by examiner

*Primary Examiner* — Donghai D. Nguyen (74) *Attorney, Agent, or Firm* — Grossman, Tucker, Perreault & Pfleger, PLLC (57) ABSTRACT

Disclosed are a coreless substrate and a method of manufacturing the same. The coreless substrate includes a solder resist layer capable of being formed on each of on a first side and a second side of a metal panel. The solder resist layer includes at least one opening. A copper layer may be plated in the at least one opening such that a height of the copper layer exceeds a height of the solder resist layer. Further, at least one dielectric layer is deposited above the copper layer, and at least one microvia drilled in the dielectric layer. The at least one microvia enables an electrical connection between at least one of the first side and the second side of the metal panel and a lower surface of the coreless substrate.

20 Claims, 9 Drawing Sheets

METHOD OF MANUFACTURING CORELESS SUBSTRATE

FIELD OF THE DISCLOSURE

The present disclosure relates to a coreless substrate, and, more particularly, to a method for manufacturing the coreless substrate for IC packaging.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

FIG. 1 (FIGS. 1A to 1Q) illustrates various conventional stages for manufacturing a coreless substrate; and FIG. 2 (FIGS. 2A to 2J) illustrates various stages for manufacturing a coreless substrate, in accordance with an embodiment of the present disclosure.

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

FIG. 1 and more specifically, FIGS. 1A through 1M, illustrate various conventional stages for manufacturing a coreless substrate.

Figure 1A:
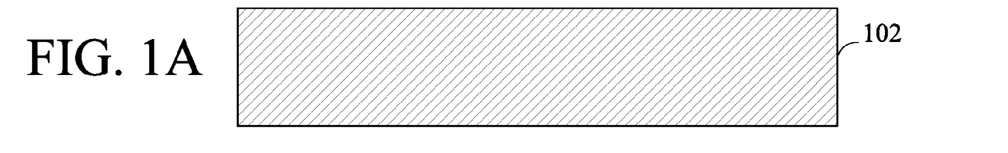

FIG. 1A illustrates a copper panel 102. The copper panel 102 may be prepared by a roughening treatment, where a chemical (acidic) solution may be used to roughened the Copper surface to foster adhesion with dielectric layers to be laminated on top or to foster adhesion with subsequently plated metal layers. Such an acid treatment, conventionally is based on a combined solution of sulfuric acid and hydrogen peroxide. However, any treatment to create proper adhesion of this Copper layer to incoming plated metal or dielectric may be used. For instance a chemical treatment, consisting of any type of treatment may be utilized. The etching treatment may utilize an etching treatment apparatus.

Figure 1B:
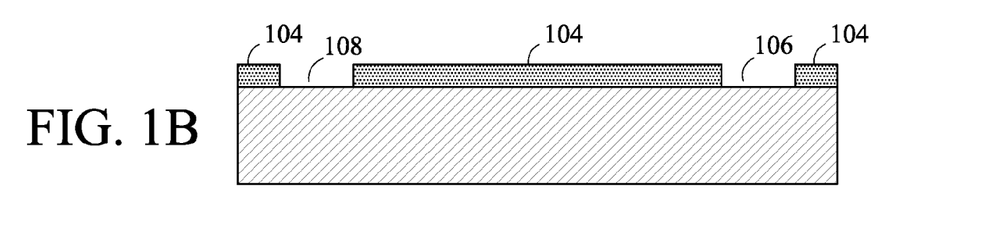

A dry film resist (which is used for patterning a surface) layer 104 may be deposited on the copper panel 102, as illustrated in FIG. 1B. The dry film resist layer 104 may be laminated n the copper panel 102 and patterned by a process of photolithography. The process of photolithography utilizes light for selectively cross linking the resist in select location, where by unexposed locations can be developed by a developer solution, which is usually a sodium carbonate solution. Note that the resist can be either a negative or a positive resist. Unexposed, and developed areas on the on the copper panel 102 form openings or patterns (herein after referred as dry film resist openings), for example, a dry film resist opening 106 and a dry film resist opening 108, in the solder resist layer 104.

Figure 1C:
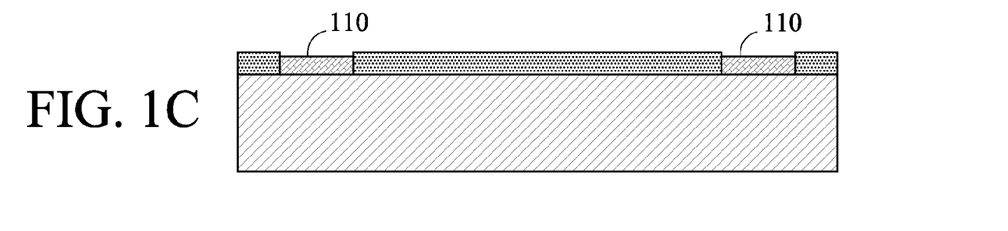
Figure 1D:
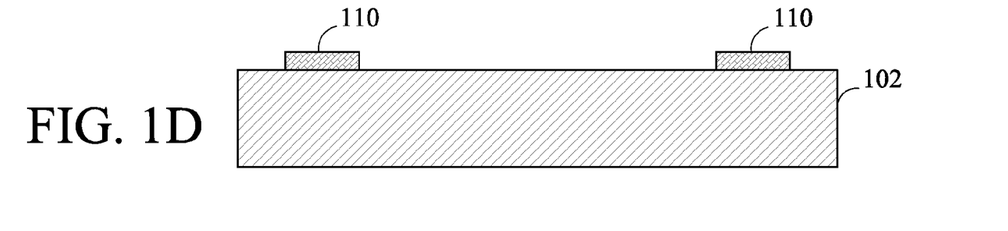

A surface finish layer 110 may be formed in the solder resist openings, as illustrated in FIG. 1C. The surface finish layer 110 may be formed by immersion, electroless plating or electroplating the resultant structure of FIG. 1B with one or more suitable metals, such as Nickel, Nickel/Gold, Nickel Palladium Gold, or immersion tin. In the current embodiment, the metals used for electroplating the dry film resist openings may include Nickel, Palladium, Gold, which are plated in the following order: Gold, followed by Palladium, followed by Nickel. After the surface finish layer 110 is deposited in the dry film resist openings 106 and 108, the dry film resist layer (not shown) may be stripped off the copper panel 102, with an alkaline solution (conventionally NaOH) thereby leaving the surface finish layer on the copper panel 102, as illustrated in FIG. 1D.

Figure 1E:
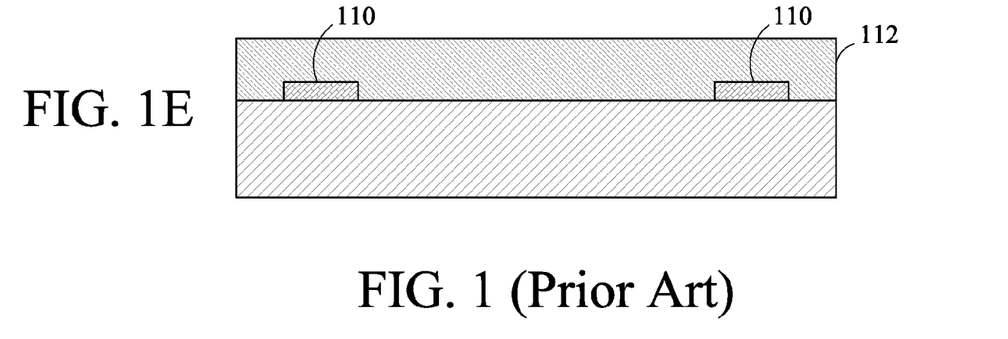

Thereafter, a dielectric layer (conventionally an epoxy based dielectric material, such as conventionally used for IC substrate packaging may be used) 112 may be laminated over the surface finish layer 110, as illustrated in FIG. 1E. The dielectric 112 layer may extend throughout a top surface (not shown) of the coreless substrate, thereby covering the surface finish layer 110.

Figure 1F:
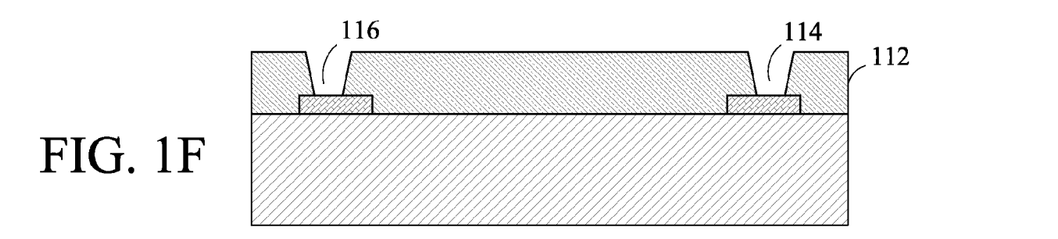

Subsequently, a plurality of vias, for example, a via 114 and a via 116, may be drilled in the dielectric layer 112. The plurality of vias in the dielectric layer 112 are illustrated in FIG. 1F. The vias may be drilled mechanically into the dielectric layer 112 or by a laser drilling process. The vias enable electrical connection between various layers of a multi-layer coreless substrate.

Figure 1G:
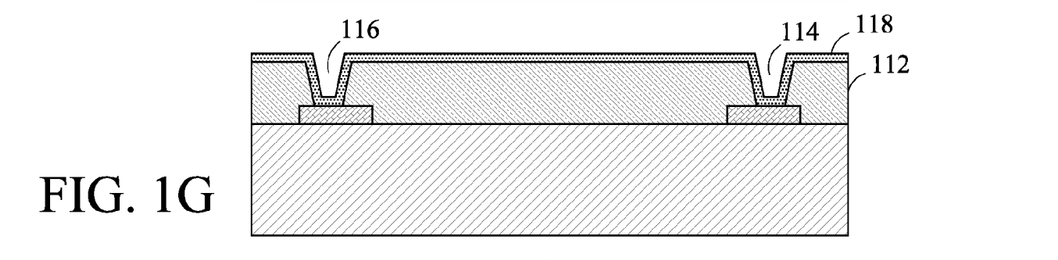
Figure 1H:
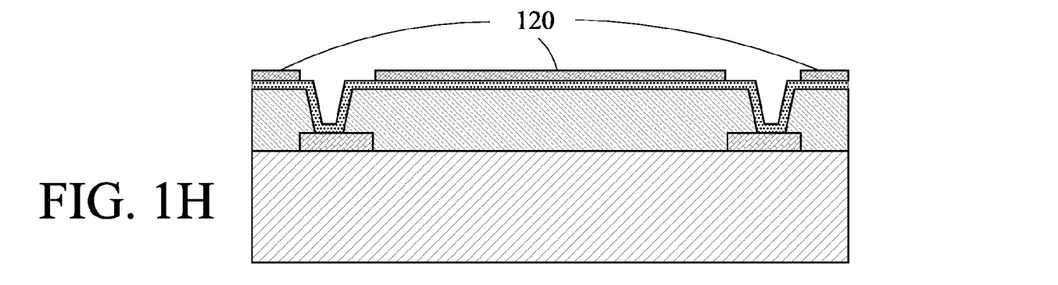
Figure 1I:
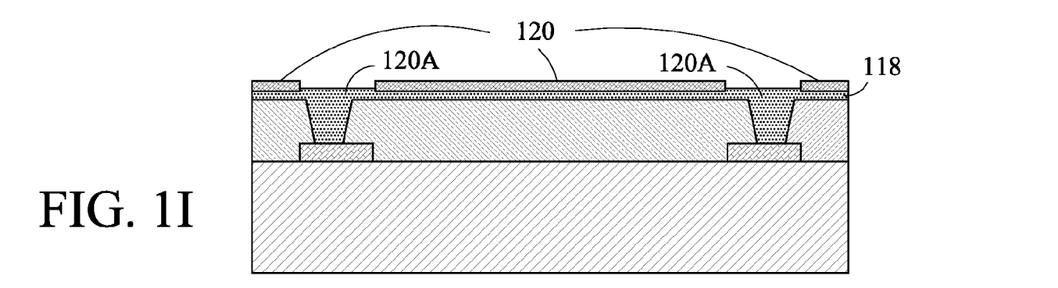
Figure 1J:
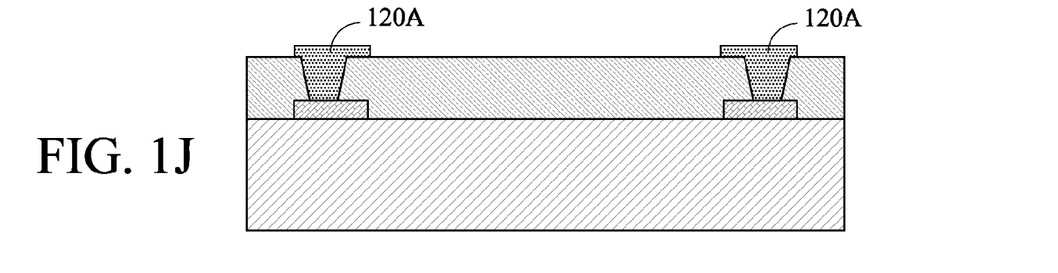

The Via surface may be cleaned to remove debris and smear residue by a desmear process based on permanganate chemistry as is conventionally done in substrate manufacturing. Any other cleaning method may be used to clean the vias formed and insure proper connection between subsequent metal layers. A copper layer 118 may be deposited on the resulting substrate by electroless copper plating, as illustrated in FIG. 1G. The electroless copper plating is plated by first catalyzing the surface with a palladium seed, followed by electroless copper plating from an electroless copper plating solution on the dielectric layer 112. This may be done in order to make the surface conductive and allow further metallization by electroplating. Thereafter, a resist pattern 120 is formed on the copper layer 118, as illustrated in FIG. 1H. The resist pattern 120 may be obtained by a process of resist lamination and photolithography. Using the formed resist pattern 120, a circuit pattern 120A is formed by electrolytic copper plating. The circuit pattern 120A may be formed by an electrolytic copper plating layer and the microvias are filled with the copper metal, as illustrated in FIG. 1I. After the formation of the circuit pattern 120 A, the resist pattern (not shown) may be removed, as illustrated in FIG. 1J. The resist pattern 120 may be removed by a process of alkaline stripping solution. A flash etching step using solution such as SPS (sodium persulfate) aqueous solution, for example, may be used in order to remove the copper seed layer which was formed earlier to allow electroplating. This flask etching step insures proper circutization of the surface. A subsequent Copper roughening step may then be done by chemical treatment such as the one mentioned earlier, in order to foster adhesion between the copper layer and incoming dielectric layer.

Figure 1K:
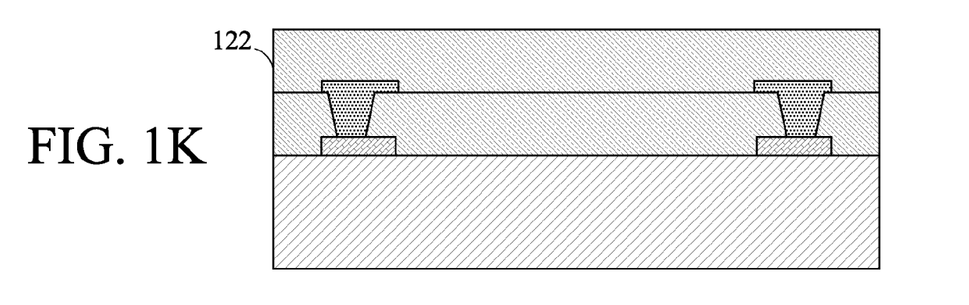
Figure 1L:
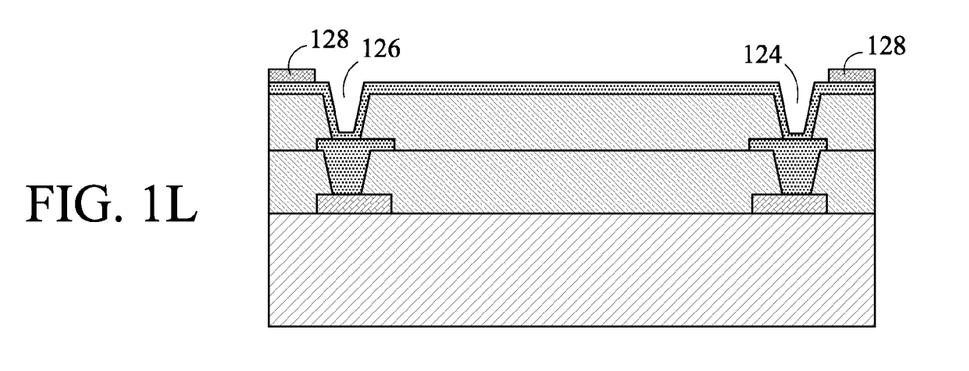
Figure 1M:
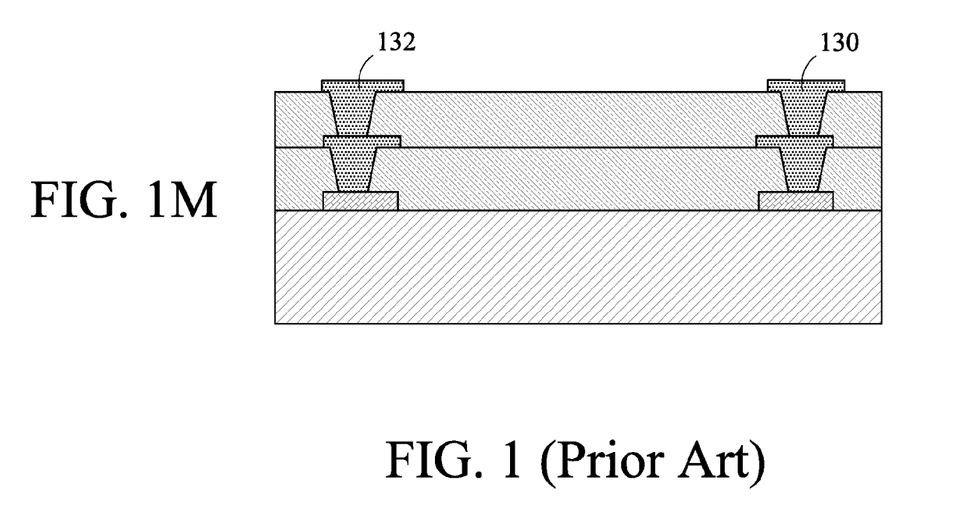

The number of layers constituting the coreless substrate may be continuously increased by repeating the steps of laminating a dielectric material, followed by via drilling, desmear, electroless plating, pattern formation, electroplating, resist removal, flash etching and copper roughening, thereby creating further metallized layers, for example, a dielectric layer 122 (as illustrated in FIG. 1K); creating the circuit patterns by drilling of vias, for example, a via 124 and a via 126, in the dielectric layers, and forming a resist pattern 128 over the dielectric layers (as illustrated in FIG. 1L). Further, the vias, for example, the via 124 and the via 126 may be filled with copper metal (shown by marker 130 and 132) and stripping may be done to remove the resist material (as illustrated in FIG. 1M).

Figure 1N:
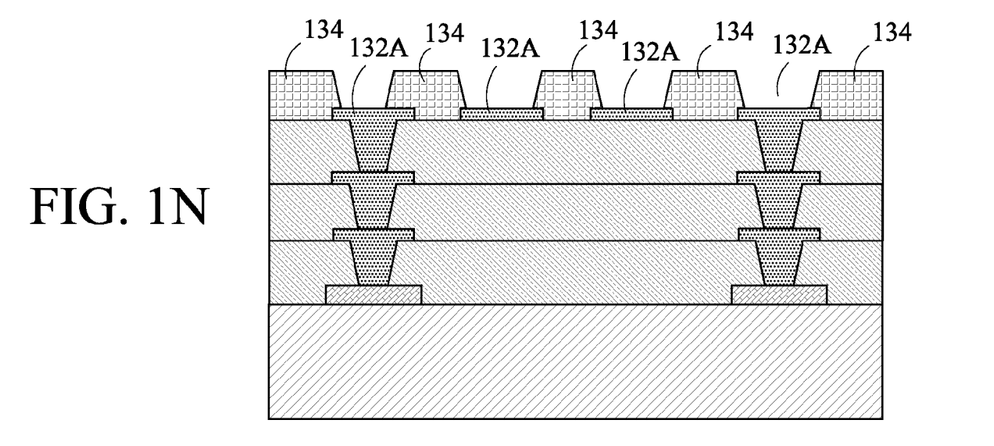
Figure 1O:
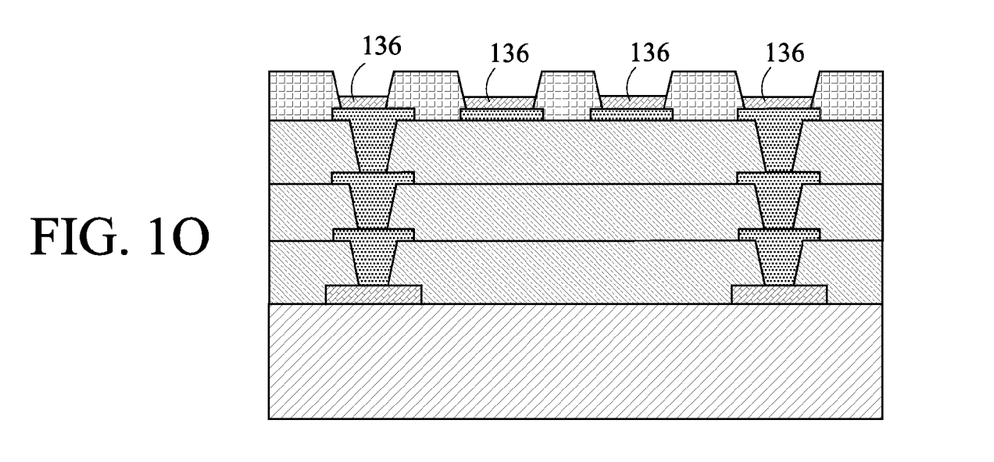

Additionally, a solder resist layer 134 (as illustrated in FIG. 1N) may be formed on a circuit pattern in a subsequent layer, thereby creating a multilayered coreless substrate. The FIG. 1N is shown to include traces and vias 132A for electrically connecting the layers of the multi-layered coreless substrate. Further, a surface finish layer 136 may be electrolessly plated in solder resist openings in a circuit pattern (as illustrated in FIG. 1O). Alternatively, surface finish electroplating or immersion may be done depending on the chemistry of choice for surface finish.

Figure 1P:
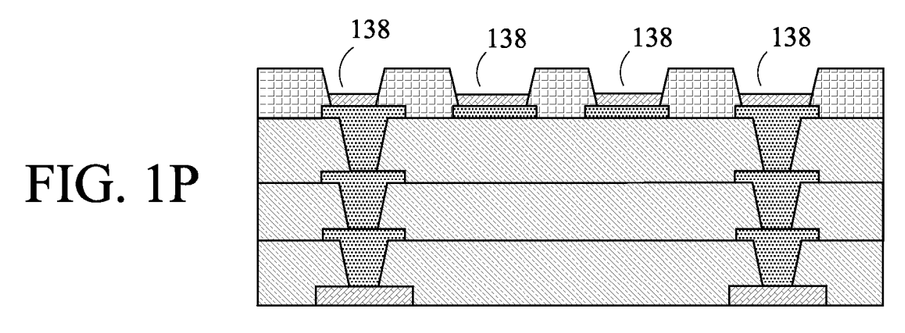
Figure 1Q:
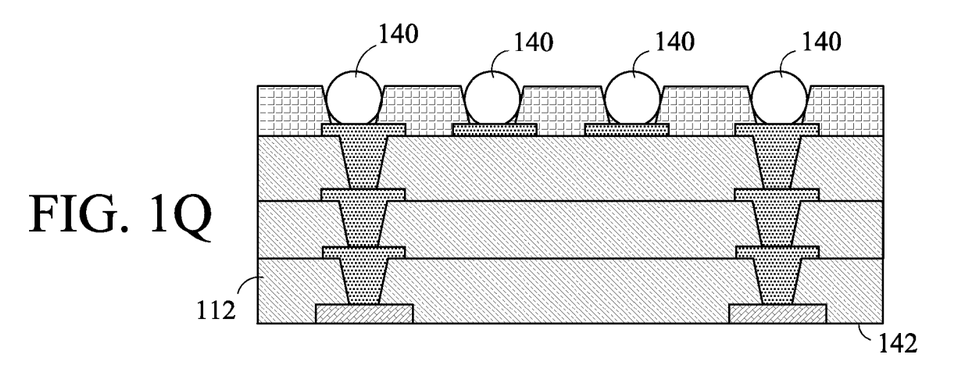

Thereafter, the copper panel (not shown) may be separated from the coreless substrate. The resulting structure may include openings, for example, the openings 138, as illustrated in FIG. 1P. The openings 138 may be configured to receive solder balls 140 of an (Integrated Circuit) IC package, as illustrated in FIG. 1Q.

However, with such a configuration of the coreless substrate, the solder joint reliability on a BGA side (marked as 142) of the coreless substrate, may not be satisfactory for some applications. Additionally, there may be no anchor for solder balls (not shown) underneath the dielectric layer 220. This may further cause potential challenges with solder joint reliability on the BGA substrate.

FIG. 2 and more specifically, FIGS. 2A through 2J illustrates various stages for manufacturing a coreless substrate, in accordance with an embodiment of the present disclosure.

Figure 2A:
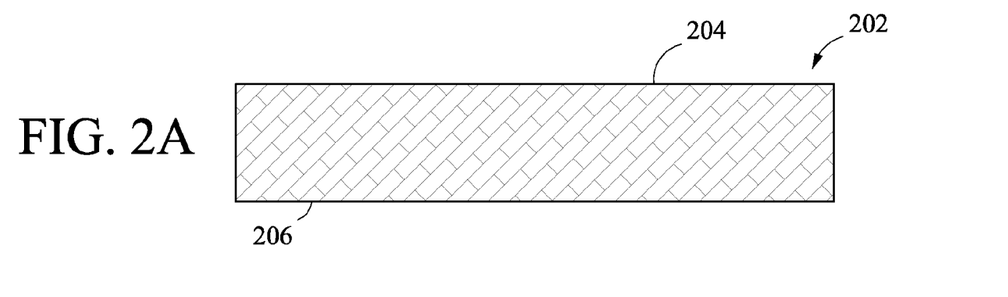

A metal panel 202 is illustrated in FIG. 2A. In one embodiment, the metal panel 202 may be a copper panel (hereinafter referred to as a 'copper panel 202'). The copper panel 202 may be formed by an acid roughening treatment. The copper panel 202 includes a first side 204 and a second side 206 such that the first side 204 is opposite to the second side 206.

Figure 2B:
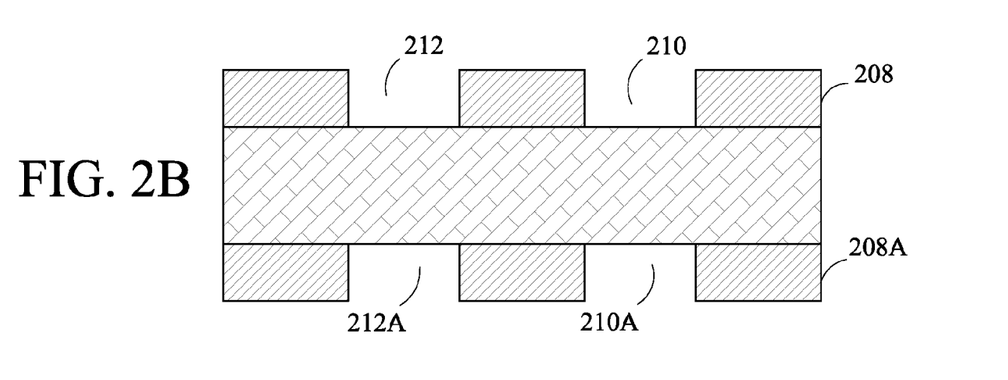

Each of the first side 204 and the second side 206 of the copper panel 202 may be laminated with a solder resist material to form a solder resist layer 208 and a solder resist layer 208A on the first side and the second side of the copper panel, respectively (See FIG. 2B). The solder resist material may be a photosensitive material. In one embodiment, the solder resist layer 208 may be formed by a dry film solder resist (DFSR). Alternatively a liquid solder resist may be used. Accordingly, when the solder resist layer 208 is exposed to light, a portion of the solder resist layer 208, which does not receive light, is not transformed. However, another portion of the solder resist layer 208 that receives light is treated by light, and is crosslinked. Only the un-crosslinked portion of the solder resist layer 208 is removed to form a pattern on the copper panel 202. The crosslinked portion may create at least one opening (herein after referred as the solder resist opening) in the solder resist layer 208, as illustrated in FIG. 2B. For example, solder resist openings 210 and 212 may be formed on the first side 204 of the copper panel 202 and openings 210A and 212A may be formed on the second side 206 of the copper panel 202. Both negative and positive solder resists may be used. In one embodiment of the disclosure, a negative solder resist is used. In one embodiment, the solder resist layer 208 may be formed up to a height of 20 micrometers.

Figure 2C:
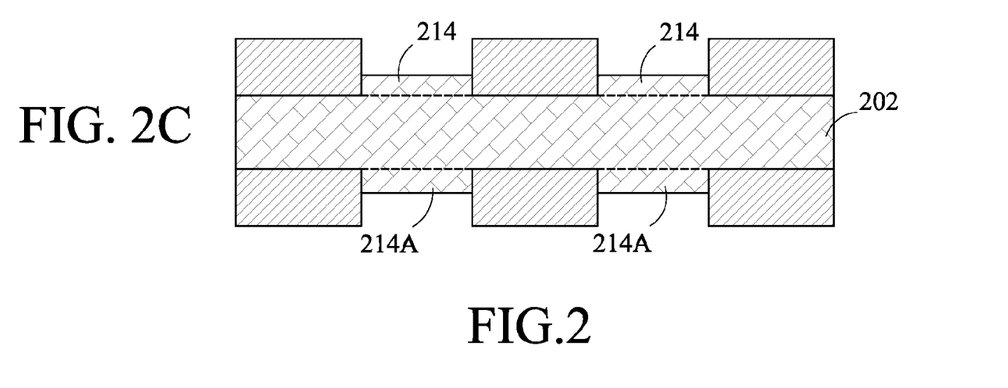

Thereafter, a metal layer 214 may be deposited into the solder resist openings on both sides of the copper panel 202. In one embodiment, the metal layer may be of copper metal. The copper metal layer 214 may be formed by electrolytically plating copper metal in the solder resist openings. As illustrated in FIG. 2C, the copper metal layer 214 may be deposited in the solder resist openings 210 and 212 on the first side of the copper panel. Moreover, a copper metal layer 214A may be deposited in the solder resist openings 210A and 212A on the second side of the copper panel. In one embodiment, the copper metal layer 214 and 214A may be deposited upto a height of 12 micrometer into the solder resist openings.

Figure 2D:
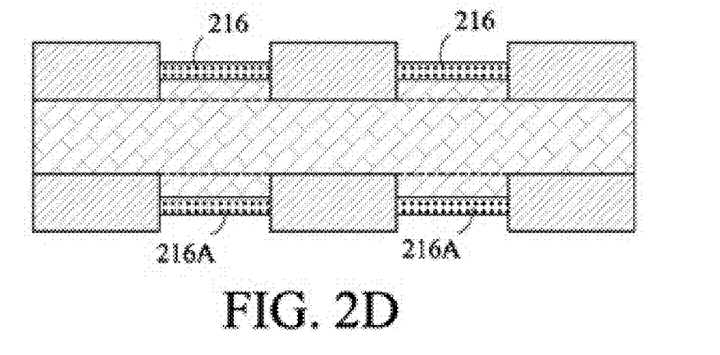

Subsequently, a surface finish layer may be formed over the copper metal layer 214 in the solder resist openings on each side of the copper panel. For example, a surface finish layer 216 may be formed in the solder resist openings 210 and 212 on the first side of the copper panel 202 and a surface finish layer 216A may be formed in the solder resist openings 210A and 212A on the second side of the metal panel as illustrated in FIG. 2D. The surface finish layers 216 and 216A may be formed by plating a layer of Nickel, Palladium and Gold electrically on top of generated copper metal layers 214 and 2214A respectively. In one embodiment, the surface finish layers 216 and 216A may be plated inversely on a top surface (not shown) of the copper metal layer 214 and 214A, since a side (including the solder resist layer 208) of the coreless substrate may serve as a ball grid array (BGA) side of the coreless substrate.

In one embodiment, the surface finish layers 216 and 216A may be formed by plating with approximately 0.06 micrometers of Gold, 0.06 micrometers of Palladium, and 5 micrometers Nickel. Alternatively, an immersion tin, electroplating of Nickel and Gold or an immersion gold plating solution may be used as a choice of surface finish. In one embodiment of the disclosure, electroplating of gold, palladium, and nickel, in the stated order may be used where the total thickness of the surface finish layers 216 and 216A may be adjusted to provide a proper solder joint reliability for the coreless substrate.

Figure 2E:
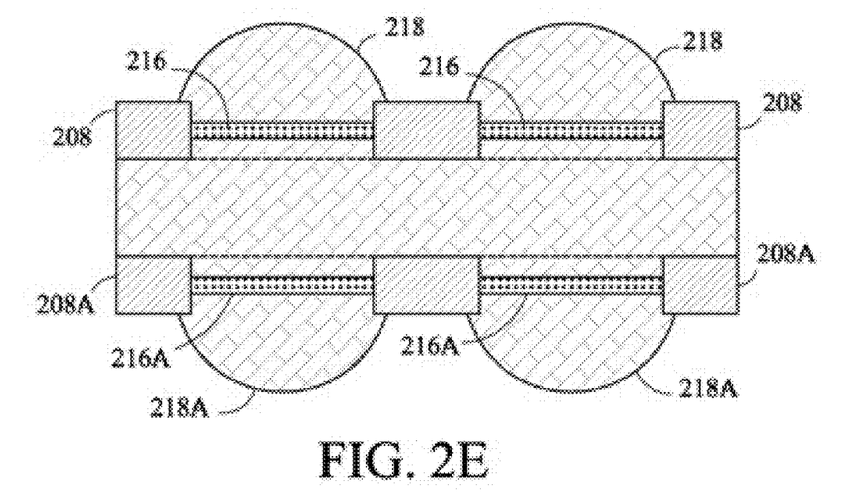

Subsequently, an over-plated copper 218 and 218A may be formed over each of the surface finish layers 216 and 216A in the solder resist openings on the first side and the second side of the copper panel (See FIG. 2E). The copper may be over-plated in each of the solder resist openings in a manner such that a height of the copper plating exceeds a height of the solder resist layer 208 and 208A. As illustrated in FIG. 2E, the over-plated copper (shown by 218 and 218A) forms a semi-circular type structure extending out of the solder resist openings (not shown). The over-plated copper may flow onto an upper surface (not shown) of the solder resist layers 208 and 208A. However, since distance between two consecutive solder resist openings of the BGA substrate is of the order of 0.4 to 0.5 mm, the over-plated copper from one solder resist opening never comes in contact with copper in another solder resist opening. Additionally, the over-plated copper may assume a protruded shape (as shown in FIG. 2E). The protruded shape may be in form of a pin structure such that the pin structure may provide a good anchor for a BGA solder contact (not shown). It should be noted that for obtaining a pin-shaped copper structure in the solder resist openings, plating conditions, for example, levelers, brighteners, flow, agitation, current type and shape (periodi reverse plating vs. DC plating) and copper solution chemistry may be adjusted, as per the requirements.

Figure 2F:
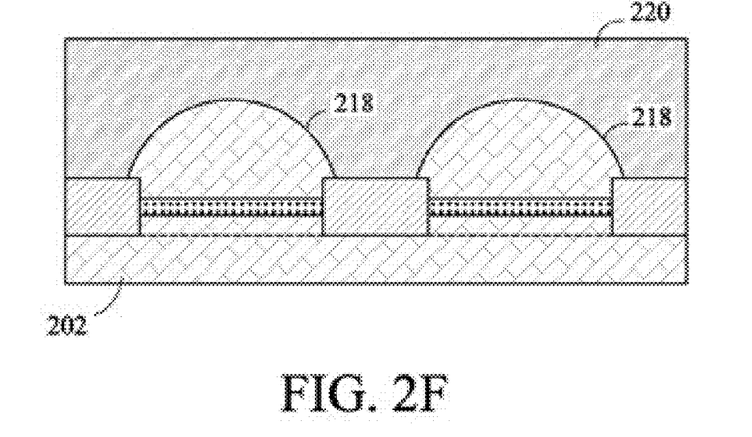

A dielectric layer 220 may be formed covering the over-plated copper (shown by 218 on the first side (not shown) of the copper panel 202), as illustrated in FIG. 2F. In one embodiment, the dielectric layer 220 may be formed with epoxy based dielectric buildup material, as conventionally used in IC substrate manufacturing.

Figure 2G:
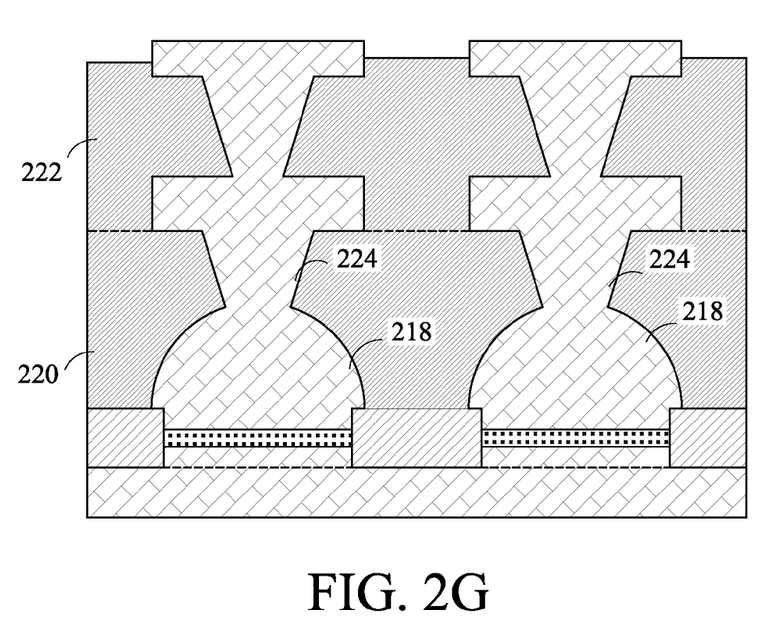

The dielectric layer 220 may be drilled by mechanical or laser means above the over-plated copper to form at least one microvia (herein after referred as the microvia) in the dielectric layer 220. The microvia, for example, a microvia 224 may rest above the over-plated copper 218, such that one end of the microvia 224 may be configured on the protruded part of the over-plated copper 218, as illustrated in FIG. 2G. The microvias 224 so formed in the dielectric layer 220 enables an electrical connection between at least one of the first side and the second side of the metal panel and a lower surface (not shown) of the coreless substrate. Vias formed are then desmeared as mentioned before and electroles sly plated with copper, after which a pattern with a dry film resist is formed, followed by electroplating, as described above. Moreover, the microvias 224 may enable an electrical connection between various layers of the coreless substrate.

Thereafter, the number of layers constituting the coreless substrate may be continuously increased by repeating the steps of laminating the layers with a dielectric material, thereby creating further dielectric layers; drilling microvias in the dielectric layers; and plating the microvias with a layer of copper metal.

FIG. 2G illustrates a resulting configuration of the coreless substrate having two layers, for example, the layer 220 and a layer 222. The two layers are shown to include microvias 224 and microvias 226.

Figure 2H:
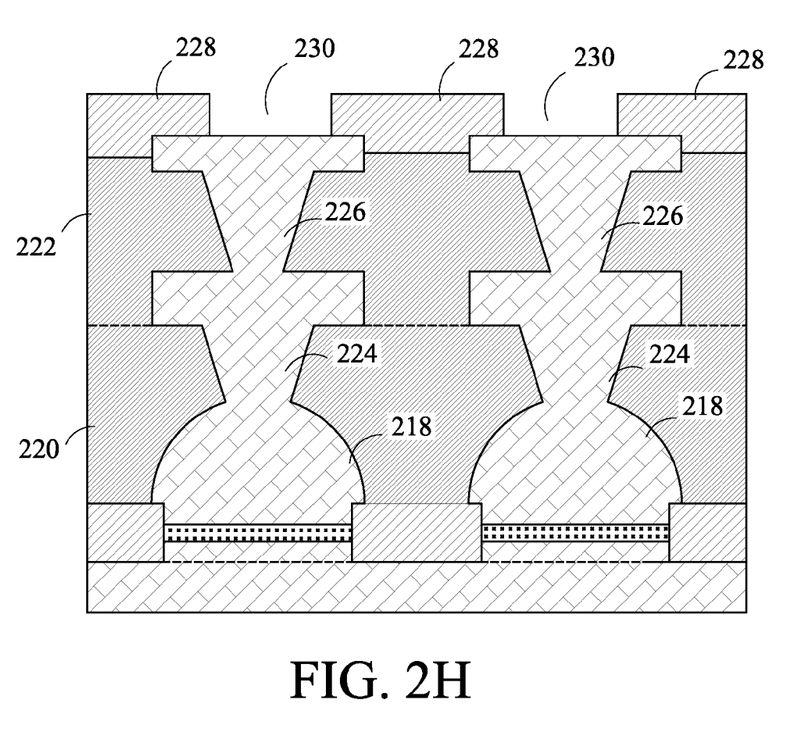
Figure 2I:
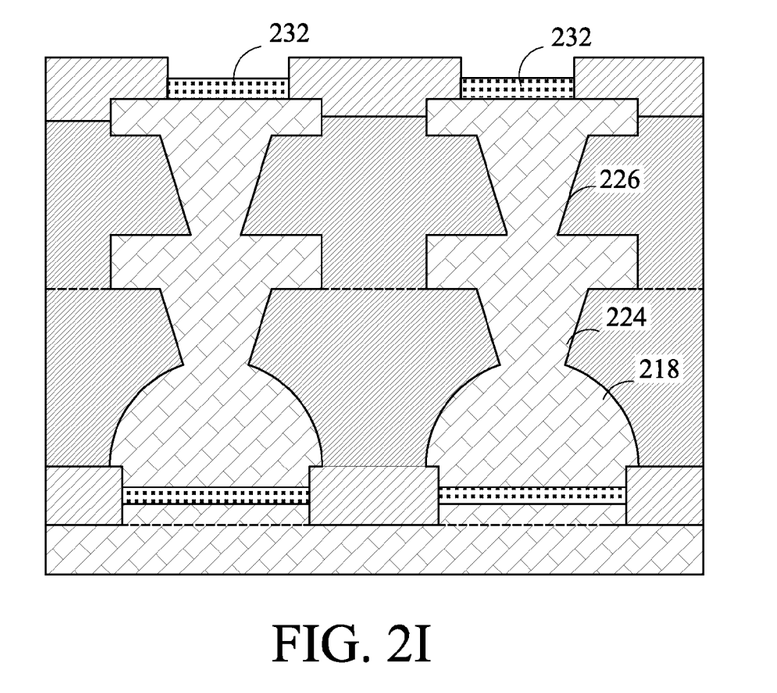

A solder resist layer 228 may be laminated on the resulting substrate from each of the first side and the second side of the copper panel 202. The solder resist layer 228 may be patterned by the process of photolithography to obtain a circuit pattern (not shown) in the solder resist layer 228. Accordingly, the solder resist layer 228 may include openings, for example, openings 230, as illustrated in FIG. 2H. The openings 230 may hereinafter be referred as solder resist openings 230. A surface finish layer 232 may be electrolessly formed into the solder resist openings 230, as illustrated in FIG. 2I. Surface finish plating may be done immersion tin or electroless Ni immersion gold, or electroless Ni, Pd, electroless gold.

FIGS. 2F through 2I are shown to include only first side of the copper panel 202. However, it should be understood that only one side of the copper plate 202 is considered for the purpose of clarity. The same stages may be performed at the second side of the copper panel, thereby forming the coreless substrate on both sides of the copper panel.

Figure 2J:
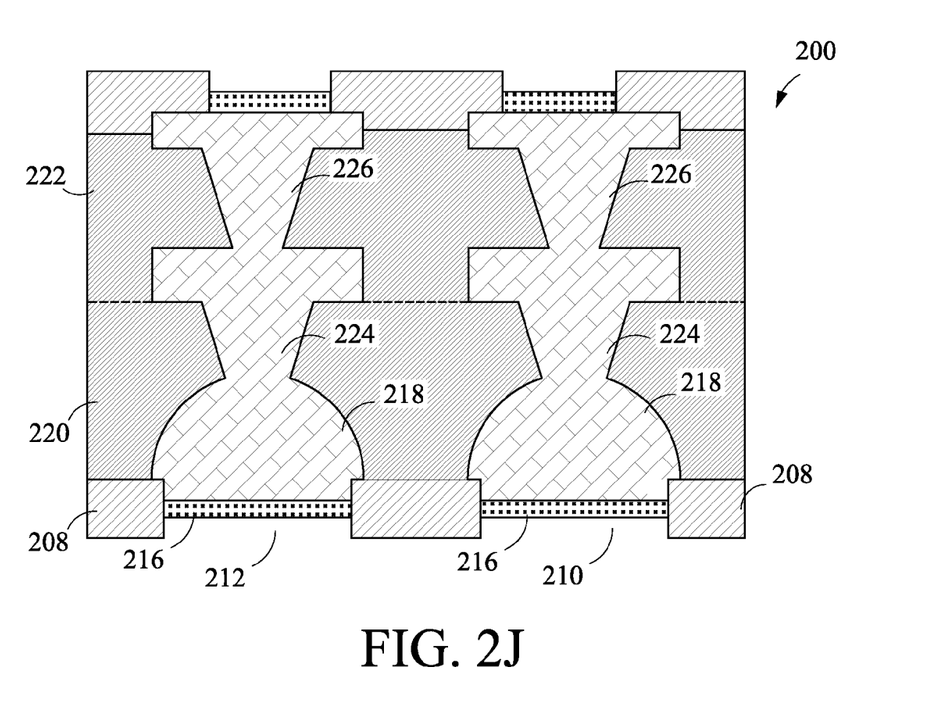

Subsequently, as shown in FIG. 2J, the copper panel (not shown) may be separated from a resultant configuration shown in FIG. 2I. Moreover, a residual copper from the solder resist openings 210 and 212 may be removed by the process of etching. In one embodiment, an alkali etching may be performed for removing the residual copper from the copper panel. Moreover, other etching techniques, for example isotropic chemical etching may also be employed. Alternatively, chemical-mechanical planarization (CMP) process may also be performed, followed by mild acid etching for removal of the residual copper.

After the removal of the copper panel and the residual copper from the solder resist openings 210 and 212, the surface finish layer, for example, the surface finish layer 216, may be recessed into the solder resist layer 208. The recession of the surface finish layer 216 may be due to the plating of copper before the surface finish layer 216 into the solder resist layer 208. Thereafter, the copper plating of the over-plated copper 218 may be etched off. The over-plated copper 218 along with the solder resist layer 208 and the solder resist openings, for example the solder resist opening 210, may form a receiving space. The receiving space may be capable of anchoring a BGA contact pad due to the over-plated copper 218.

The present disclosure provides a coreless substrate 200, as illustrated in FIG. 2J. The coreless substrate 200 includes one or more dielectric layers, for example, the dielectric layer 220 and the dielectric layer 222. The coreless substrate 200 may include the solder resist layer 208 capable of being formed each on the first side 204 and the second side 206 of the metal panel (not shown). The solder resist layer 208 includes the at least one solder resist opening 212 and 210. The surface finish layer 216 may be deposited into the at least one solder resist opening. Further, the copper layer 218 may be plated in the at least one solder resist opening above the surface finish layer 216 such that a height of the copper layer 218 exceeds a height of the solder resist layer 208, thereby forming a protruded semi-circular type structure of the plated copper. The coreless substrate 200 may also include the dielectric layer 220 deposited above the copper layer 218. It should be understood that the coreless substrate 200 may include more number of dielectric layers, for example, the dielectric layer 222 formed above the dielectric layer 220.

The coreless substrate 220 includes at least one microvia drilled in the dielectric layer 220. The microvia 224 enables an electrical connection between at least one of the first side and the second side of the metal panel (not shown) and a lower surface (not shown) of the coreless substrate 200. Moreover, the microvias, for example, a microvia 226, may enable electrical connection between the one or more dielectric layers, for example, between the dielectric layer 220 and the dielectric layer 222.

The present disclosure provides a coreless substrate and a method illustrating various stages of manufacturing the same. The coreless substrate includes a lamination of dry film solder resist on both sides of the coreless substrate, thereby providing a double sided coverage to the coreless substrate. Moreover, the double sided dry film solder resist provides a transparency to an assembly line. Additionally, the coreless substrate includes an anchoring underneath the solder resist layer formed by an over-plated copper layer on the solder resist layer, thereby enhancing solder joint reliability for a ball attachment of a BGA substrate with the coreless substrate.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omissions and substitutions of equivalents are contemplated as circumstance may suggest or render expedient, but such omissions and substitutions are intended to cover the application or implementation without departing from the spirit or scope of the claims of the present disclosure.

What is claimed is:

1. A method for manufacturing a coreless substrate, the method comprising:
    forming at least one solder resist layer on at least one of a first side and a second side of a metal panel;
    forming a first and at least a second opening in the at least one solder resist layer extending to the metal panel;
    forming a metal plating comprising copper directly on the surface of the metal panel in the first and at least second opening by electroplating;
    forming a surface finish layer on the metal plating in each of the first and at least second opening;
    electrolytic plating the surface finish layer in each of the openings with copper to form a discrete copper plating on the surface finish layer in each of the first and at least second opening, each discrete copper plating having a pin shape extending over a portion of the solder resist layer and a height which exceeds a height of the solder resist layer;
    forming at least one dielectric layer covering the discrete copper platings; and
    forming at least one microvia in the at least one dielectric layer, wherein at least a portion of the microvia extends to said discrete copper plating in each of said first and at least second opening; and separating said metal panel and said metal plating from said at least one solder resist layer and said surface finish layer.

2. The method of claim 1, wherein forming the at least one solder resist layer comprises coating the metal panel with a solder resist by a process of lamination and photolithography.

3. The method of claim 2, wherein the solder resist is a Dry Film Solder Resist (DFSR).

4. The method of claim 1, wherein the metal panel is a copper panel.

5. The method of claim 1, wherein forming the metal plating in each of the first and at least second opening comprises plating metal in the at least one solder resist layer to about 12 micrometers of a height of the at least one solder resist layer.

6. The method of claim 1, wherein a material used for forming the surface finish layer is a metal selected from a group comprising at least one of Nickel, Palladium and Gold.

7. The method of claim 6, wherein forming the surface finish layer comprises plating the metal inversely on the at least one opening.

8. The method of claim 1 further comprising forming another solder resist layer over the at least one dielectric layer.

9. The method of claim 8 further comprising:
    performing etching of a residual metal of the metal panel and said metal plating.

10. A method for manufacturing a coreless substrate, the method comprising:
    forming at least one solder resist layer on at least one of a first side and a second side of a metal panel, said metal panel comprising copper;
    forming a first and at least one second opening in the at least one solder resist layer extending to the metal panel;
    forming a metal plating comprising copper directly on the surface of the metal panel in the first and at least second opening by electroplating;
    forming a surface finish layer comprising nickel on the metal plating in each of the first and at least second opening;
    forming first discrete copper platings by electrolytically plating the surface finish layer in each of the first and at least one second openings with copper, each of said first discrete copper platings having a pin shape extending over a portion of the solder resist layer and a height which exceeds a height of the solder resist layer;
    forming at least one first dielectric layer covering the discrete copper platings;
    forming at least one microvia in the at least one dielectric layer, at least a portion of said first microvia extends to said first discrete copper plating; and separating said metal panel and said metal plating from said at least one solder resist layer and said surface finish layer.

11. The method of claim 10, wherein forming the at least one solder resist layer comprises coating the metal panel with a solder resist by a process of lamination and photolithography.

12. The method of claim 11, wherein the solder resist is a Dry Film Solder Resist (DFSR).

13. The method of claim 10, further comprising:
    depositing copper in said at least one first microvia;
    forming at least one second dielectric layer on said at least one first dielectric layer;
    forming at least one second microvia in said at least one second dielectric layer, at least a portion of said second microvia extending to said first microvia; and
    depositing copper in said at least one second microvia.

14. The method of claim 1, wherein each discrete copper plating comprises a lower portion extending into a respective one of said openings and an upper portion having a semicircular structure extending out over an upper surface of said solder resist layer.

15. The method of claim 10, wherein each discrete copper plating comprises a lower portion extending into a respective one of said openings and an upper portion having a semicircular structure extending out over an upper surface of said solder resist layer.

16. The method of claim 1, wherein forming said surface finish layer on the metal plating comprises depositing a layer comprising gold on the metal plating, depositing a layer comprising palladium on the layer of gold, and depositing a layer comprising nickel on the layer of palladium.

17. The method of claim 16, wherein said layer comprising gold, layer comprising palladium, and layer comprising nickel are deposited by electroplating.

18. The method of claim 10, wherein forming said surface finish layer on the metal plating comprises depositing a layer comprising gold on the metal plating, depositing a layer comprising palladium on the layer of gold, and depositing a layer comprising nickel on the layer of palladium.

19. The method of claim 18, wherein said layer comprising gold, layer comprising palladium, and layer comprising nickel are deposited by electroplating.

20. The method of claim 10, further comprising:
    depositing copper in said at least one first microvia so as to form a second discrete copper plating, the second discrete copper plating having a pin shape extending over a portion of the first dielectric layer and a height which exceeds a height of the first dielectric layer;
    forming at least one second dielectric layer on said at least one first dielectric layer; and
    forming at least one second microvia in said at least one second dielectric layer, at least a portion of said second microvia extending to said second discrete copper plating.

* * * * *